US008090918B2

(12) United States Patent
Fang et al.

(10) Patent No.: US 8,090,918 B2
(45) Date of Patent: Jan. 3, 2012

(54) ELECTRONIC STORAGE DEVICE WITH IMPROVED STORAGE METHOD

(75) Inventors: Tzu-Wei Fang, Chung Ho (TW); Shih-Fang Hung, Chung HO (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 329 days.

(21) Appl. No.: 12/573,059

(22) Filed: Oct. 2, 2009

(65) Prior Publication Data

US 2010/0274951 A1 Oct. 28, 2010

(30) Foreign Application Priority Data

Apr. 24, 2009 (CN) .......................... 2009 1 0031588

(51) Int. Cl.
*G06F 12/00* (2006.01)
(52) U.S. Cl. ..................................................... 711/162
(58) Field of Classification Search .................... None
See application file for complete search history.

(56) References Cited

U.S. PATENT DOCUMENTS

| | | | |
|---|---|---|---|
| 7,299,316 B2 * | 11/2007 | Chou et al. .................... | 711/103 |
| 7,574,560 B2 * | 8/2009 | MacHardy et al. ........... | 711/114 |
| 7,594,157 B2 | 9/2009 | Choi et al. | |
| 2010/0082892 A1 * | 4/2010 | Ma et al. ....................... | 711/103 |
| 2010/0146256 A1 * | 6/2010 | Luo et al. .......................... | 713/2 |

* cited by examiner

*Primary Examiner* — Hiep Nguyen
(74) *Attorney, Agent, or Firm* — Cheng-Ju Chiang

(57) ABSTRACT

An electronic storage device includes a first memory segment having at least one source block to store information, a second memory segment having at least one backup block corresponding to the source block to make a backup of the information in a LSB memory page of the source block and a control unit connecting with said first memory segment and second memory segment. The control unit reads/writes the first memory segment and second memory segment through two different signal channels respectively. The information can be simultaneously written into the first and second memory segment to get a backup of the information so that the information can be stored safely. The control unit recycles the backup block of the second memory segment not only after the source block of the first memory segment entirely finishes writing the information but also after the source block is erased up in order to release the storage space of the backup block.

10 Claims, 6 Drawing Sheets

ELECTRONIC STORAGE DEVICE WITH IMPROVED STORAGE METHOD

BACKGROUND OF THE INVENTION

1. Field of the Invention

The present invention is related to an electronic information storage device, which can be used in Multi-Level Cell flash memory to revise the information.

2. Description of the Related Art

Nowadays, Flash Memory Technology has been widely used and makes it convenient to store the information into the flash memory instead of traditional hard disk. The Flash Memory is non-volatilizable with low power consumption, high reading/writing speed and anti-shock performance, which is widely used in PC, Notebook, PDA and Cell phone. NAND flash memory is one type of the Multi-Level Cell (MLC) flash memory and has many advantages such as large capacity, low cost and high reading/writing speed. In order to improve the capacity and cut down the cost further, a Single-Level Cell (SLC) flash memory with a Floating Gate is widely spread to save a NAND flash memory of the Multi-Level Cell flash memory which has two bits.

However, said NAND flash memory of Multi-Level Cell (MLC) flash memory still has some limitations comparing to the Single-Level Cell (SLC) flash memory. For example, after the memory segment of the NAND Flash memory has been erased up, Number-Of-Programming (NOP) of every memory page inside of the memory segment can only be set as 1. Other limitations such as short lifetime, long time programming, requirement of an Error Correction Code (ECC) with high correcting ability, further more, it is prerequisite to start reading from a memory page with a lower address in the memory segment while programming the information.

During programming the MLC flash memory, two bits of said Single-Level Cell flash memory form two memory pages in a same memory segment, which defines a pair of Paired Memory Pages: a LSB (Least Significant Bit) memory page and a MSB (Most Significant Bit) memory page. Although the LSB memory page and the MSB memory page are two different memory pages, actually, both said LSB memory page and MSB memory page store the information in a same memory segment. In said paired memory pages, the address of said LSB memory page is not adjacent to the address of said MSB memory page, which makes the LSB and MSB memory pages likely to record different instruction codes during the information is written. As a result, after the information is written into the LSB memory page, the instruction code may be suspended while the information is written into the MSB memory page, which may lead an error onto the LSB memory page and makes the information in the LSB memory page lost.

FIGS. 1A, 1B and 1C disclose a prior art about a programming process of the LSB memory page and the MSB memory page. As shown in FIG. 1A, the MLC flash memory includes four statuses during the programming process, such as "U", "A", "B" and "C". Each status is shown as two binary bits which respectively define a Lower Bit of the LSB memory page and an Upper Bit of the MSB memory page. In FIG. 1B, when the information is written into the LSB memory page, the bit is programmed from "1" to "0" so that the status of MLC flash memory changes into "A" from "U" for writing the information into LSB memory page. If the information requires a bit "1" of the LSB memory page, the status will keep on "U" without changing. When the information is written into the MSB memory page, the bit of the LSB memory page will be programmed as follow:

(1) If both the Lower Bit of the LSB memory page and the Upper bit of the MSB memory page is "1", the status of the MLC flash memory stays in "U";

(2) If the Lower Bit of the LSB memory page is "1" and the Upper Bit of the MSB memory page is "0", the status of the MLC flash memory is programmed from "U" to "C";

(3) If the Lower Bit of the LSB memory page is "0" and the Upper Bit of the MSB memory page is "1", the status of the MLC flash memory stays in "A";

(4) If the Lower Bit of the LSB memory page is "0" and the Upper Bit of the MSB memory page is "0", the status of the MLC flash memory is programmed from "A" to "B".

In said paired memory pages, after the information is programmed into the LSB memory page, the control unit starts to program the information into the MSB memory page of said paired memory pages, meanwhile, if the power is suddenly disconnected, an error will occur to the MSB memory page, as a result, the information written on the MSB memory page will be lost. Even worse, the information previously written in the LSB memory page will be lost too.

Hence, it is desired to have a new electronic storage device with an improved storage method for storing the information in order to solve the problems above.

SUMMARY OF THE INVENTION

Accordingly, an object of the present invention is to provide an electronic storage device which can keep the information safely even when an error occurs.

In order to achieve above object, an electronic storage device is provided and comprises a first memory segment having at least one source block to store information, a second memory segment having at least one backup block corresponding to said source block to make a backup of the information in a LSB memory page of said source block and a control unit connecting with said first memory segment and second memory segment. Said control unit reads/writes the first memory segment and second memory segment through two different signal channels respectively, the control unit recycles the backup block of the second memory segment not only after the source block of the first memory segment entirely finishes writing the information but also after said source block is erased up.

Other objects, advantages and novel features of the invention will become more apparent from the following detailed description when taken in conjunction with the accompanying drawings.

DETAILED DESCRIPTION OF THE PREFERRED EMBODIMENTS

Reference will now be made in the detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Figure 1A:
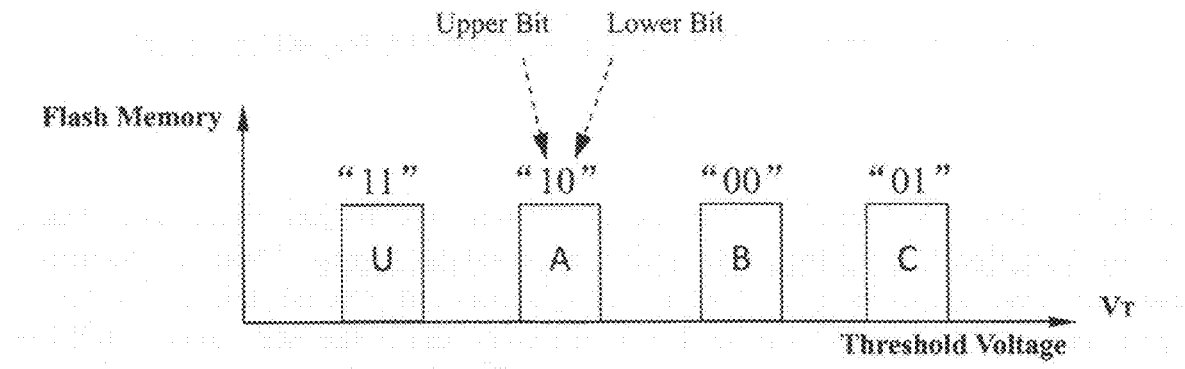
FIG. 1A is a prior art showing four statuses of the MLC flash memory.
Figure 1B:
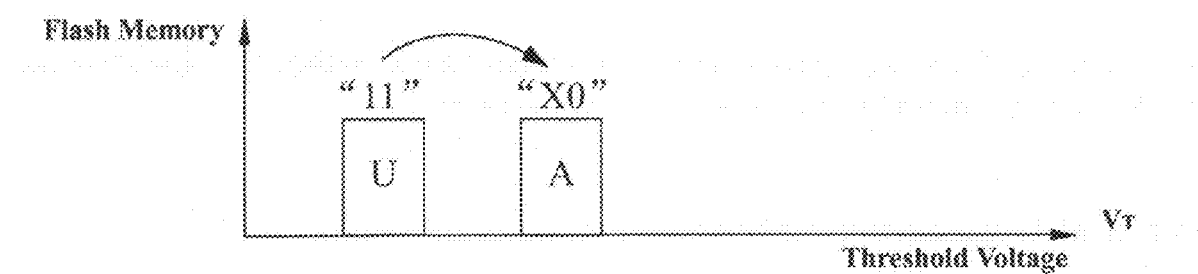
FIG. 1B is a prior art showing a programming process of the LSB memory page.
Figure 1C:
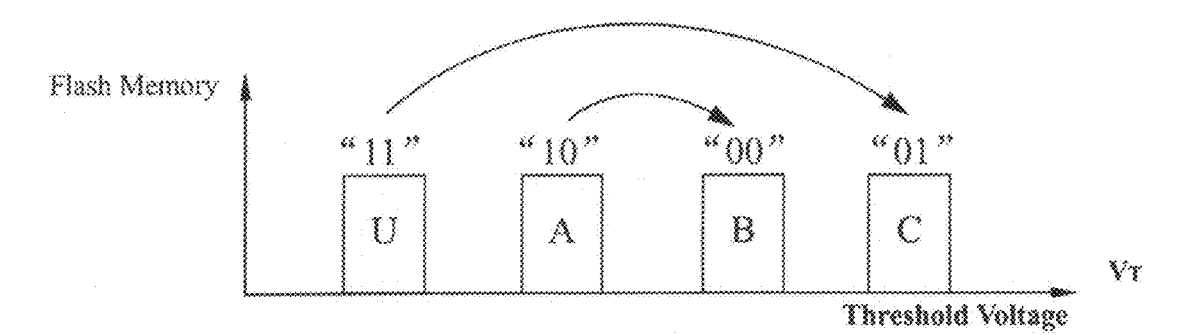
FIG. 1C is a prior art showing a programming process of the MSB memory page.
Figure 2A:
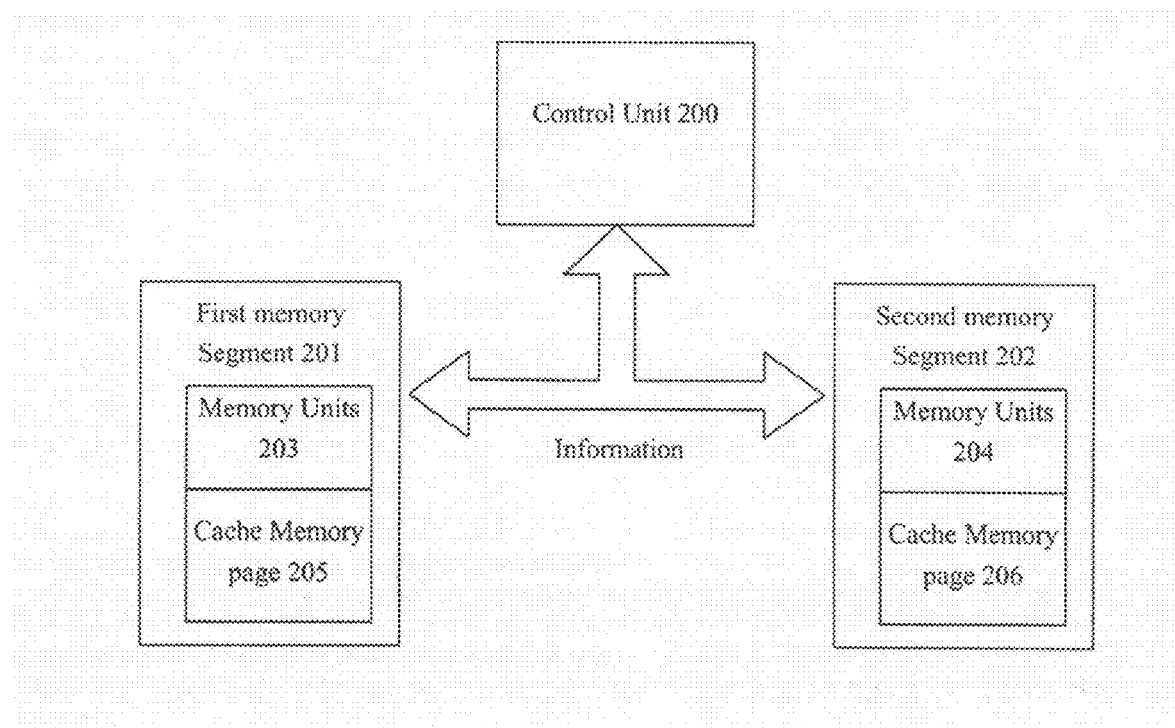
FIG. 2A is a brief view of a first preferred embodiment according to the present invention, showing a first framework of the storage device.

It will be noted that for a better understanding, like elements are designated by like reference numerals throughout the various Figures. FIG. 2A shows a first framework of an electronic storage device according to a first preferred embodiment of the present invention. The storage media of said storage device is MLC flash memory which includes a control unit 200 for controlling a programming process of the information, a first memory segment 201 and a second memory segment 202 for storing the information respectively. Said first memory segment 201 includes an array of memory units 203 for storing the information and a cache memory page 205 for keeping the information temporarily, while the second memory segment 202 includes an array of memory units 204 and a cache memory page 206. Said control unit 200 generates two channels of signals CE1 and CE2 to get communication with said first memory segment 201 and second memory segment 202 respectively so that the first and second memory segments 201, 202 can write or read the information.

Figure 2B:
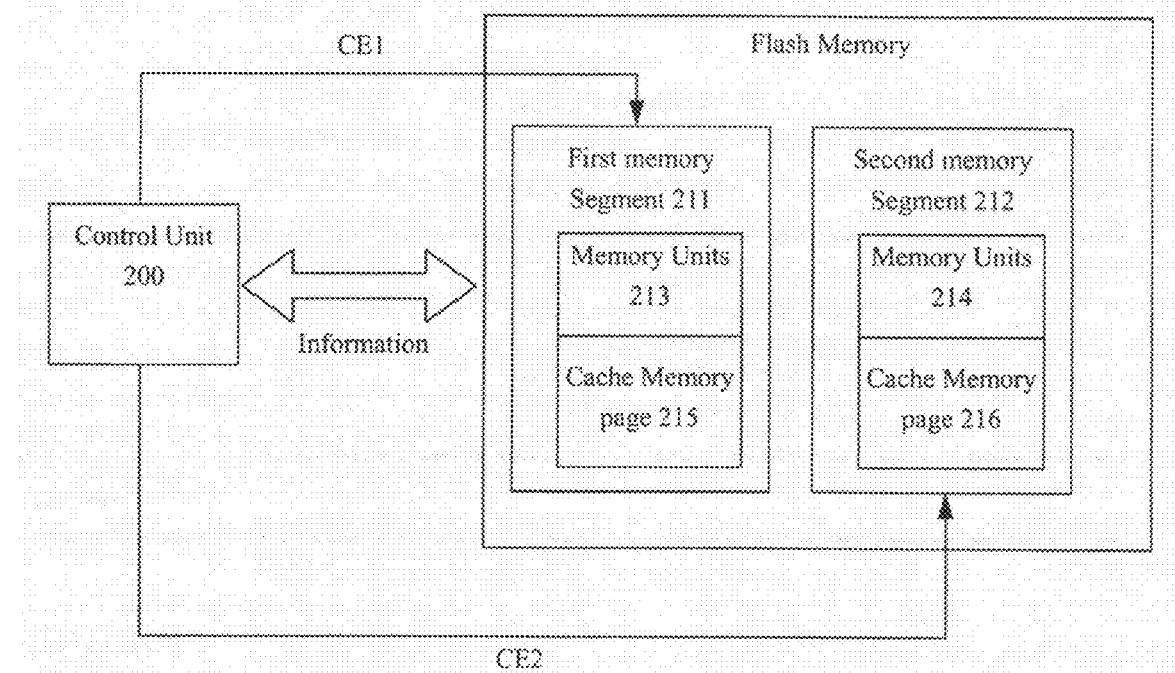
FIG. 2B is a brief view of a second preferred embodiment according to the present invention, showing a second framework of the storage device.

FIG. 2B shows a second framework of an electronic storage device according to a second preferred embodiment of the present invention. The storage media of the storage device is MLC flash memory which includes a control unit 200 for controlling a programming process of the information and a flash memory for storing the information. Said flash memory includes a first memory segment 211 and a second memory segment 212 for storing the information respectively. Each memory segment 211, 212 includes an array of memory units 213, 214 for storing the information and a cache memory page 215, 216 for keeping the information temporarily. Said control unit 200 can generates a signal channel CE1 to the corresponding first memory segment 211 so that the first memory segment 211 will be chosen to program or read the information. Another signal channel CE2 is also generated by the control unit 200 to the corresponding second memory segment 212 so that the second memory segment 212 can program or read the information.

Figure 3A:
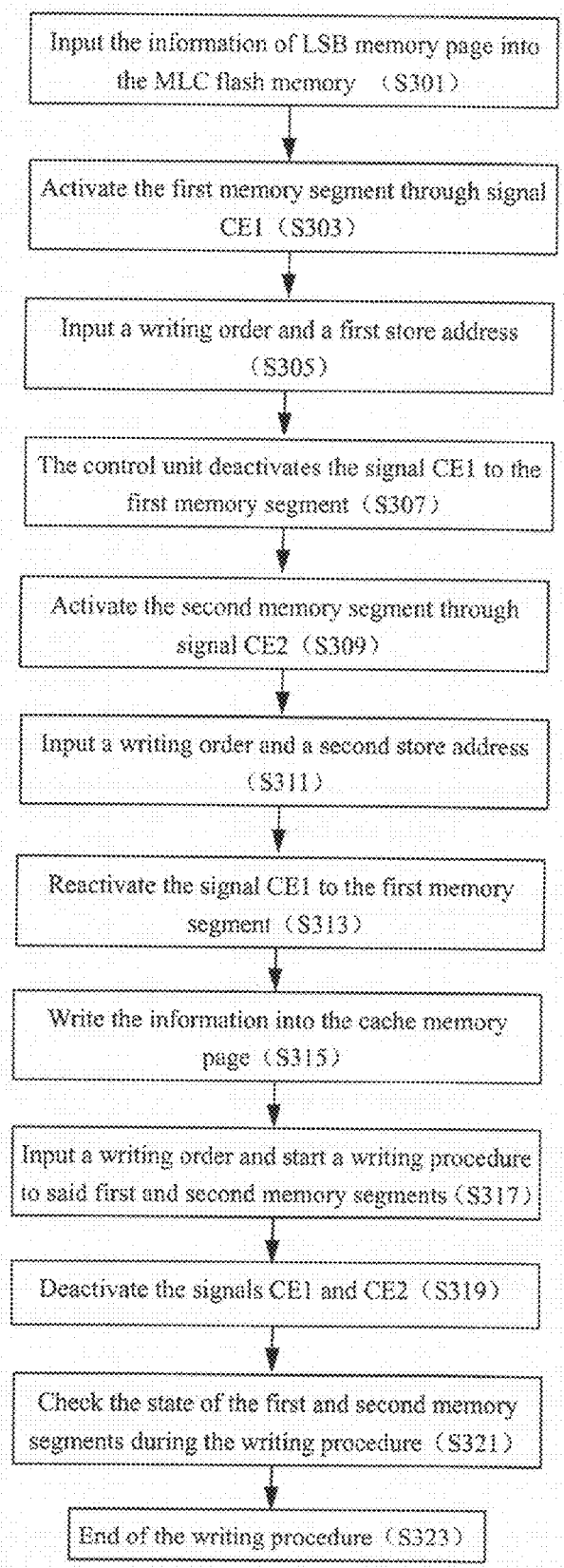
FIG. 3A is a flow chart of the first preferred embodiment of FIG. 2A, showing a programming process when the information is written into the LSB memory page.

As shown in FIG. 3A, the flow chat is a storing process of said first embodiment corresponding to FIG. 2A and includes several steps to store the information of LSB memory page into the MLC flash memory. Firstly, the information of LSB memory page is input into the MLC flash memory (shown as step S301), and then the control unit 200 activates the first memory segment 201 by signal CE1 (shown as step S303), then input a writing order and a first store address (shown as step S305), and thereafter the control unit 200 deactivates the signal CE1 to the first memory segment 201 (shown as step S307). Secondly, the control unit 200 activates the second memory segment 202 by signal CE2 (shown as step S309), then input a writing order and a second store address (shown as step S311), and thereafter reactivates the signal CE1 to the first memory segment 201 (shown as step S313), thus the signals CE1, CE2 now have been both activated so that the information can be written into the cache memory pages 205, 206 (shown as step S315). Thirdly, input a writing order to start the writing procedure of said first and second memory segments 201, 202 (shown as step S317), the information is now starting to be written into the memory units 203, 204 of said first and second memory segments 201, 202. Next, the control unit 200 deactivates the signals CE1 and CE2 (shown as step S319). Thereafter, the control unit 200 starts to check the state of said first and second memory segments 201, 202 during the information writing procedure (shown as step S321) until the control unit 200 receives two writing finishing signals respectively from the memory segments 201, 202 which means an end of the writing procedure (shown as step S323). As a result, the information has been written not only into the first memory segment 201 but also into the second memory segment.

Figure 3B:
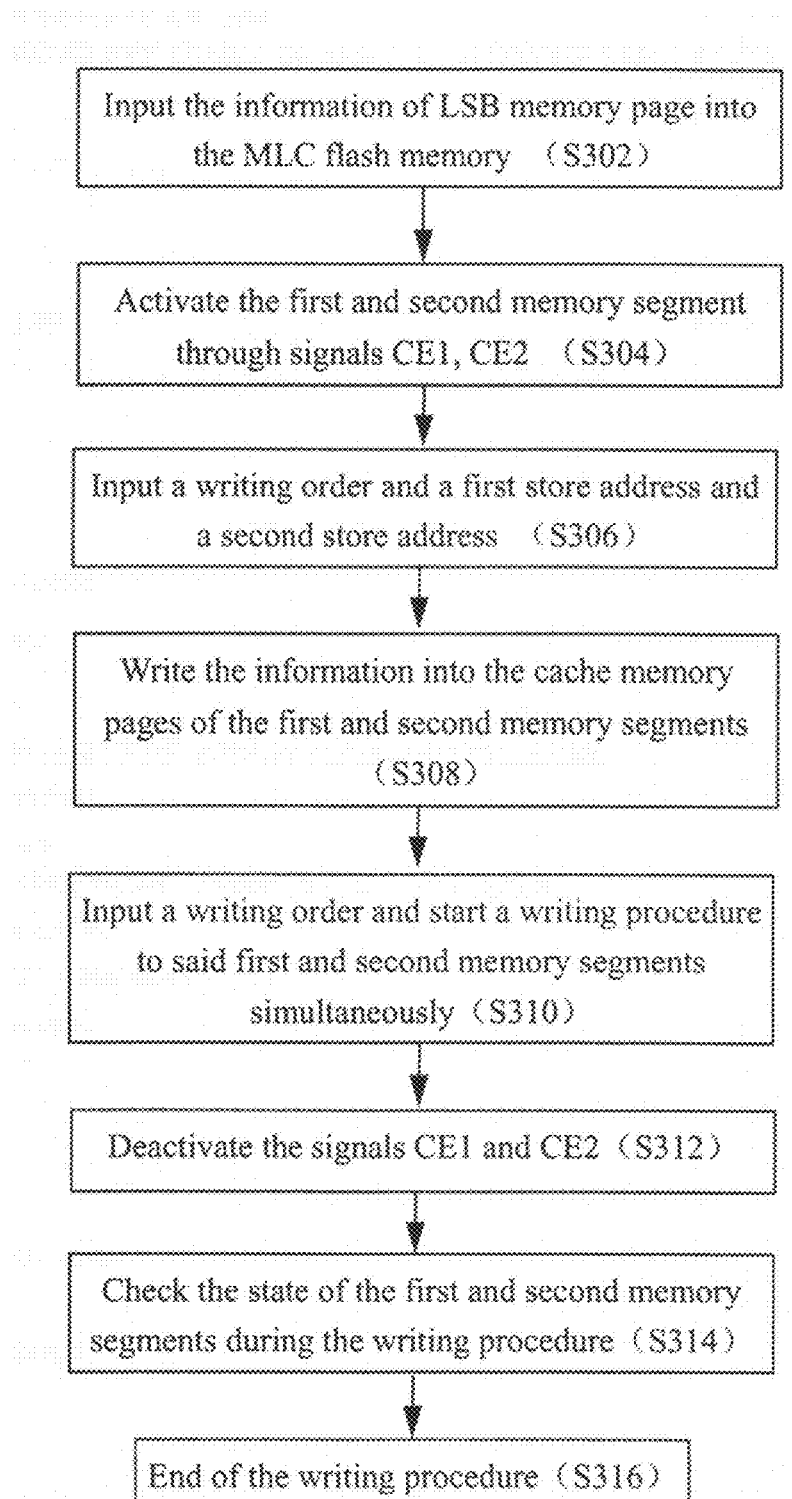
FIG. 3B is a flow chart of the second preferred embodiment of FIG. 2B, showing a programming process when the information is written into the LSB memory page.

As referring to FIG. 3B, the flow chat is a storing process of said second embodiment corresponding to FIG. 2B and includes several steps to store the information of LSB memory page into the MLC flash memory. Firstly, the information of LSB memory page is input into the MLC flash memory (shown as step S302), and then the control unit 200 simultaneously activates the first memory segment 211 and second memory segment 212 by signals CE1 and CE2 (shown as step S304), then input a writing order and a first store address and a second store address (shown as step S306), and thereafter write the information into the cache memory pages 215, 216 (shown as step S308). Thirdly, input a writing order to start the writing procedure of said first and second memory segments 211, 212 simultaneously (shown as step S310), the information is now starting to be written into the memory units 213, 214 of said first and second memory segments 211, 212. Next, the control unit 200 deactivates the signals CE1 and CE2 (shown as step S312). Thereafter, the control unit 200 starts to check the state of said first and second memory segments 211, 212 during the information writing process (shown as step S314) until the control unit 200 receives two writing finishing signals respectively from the memory segments 211, 212 which means an end of the writing process (shown as step S316). As a result, the information has been written not only into the first memory segment 211 but also into the second memory segment 212.

In order to keep the information safely during the writing process, the MLC flash memory further includes a Backup Block and a Logic-to-Entity converting sheet which records a Backup Block Address. During the writing process, when the previous written information is lost because of a sudden suspending, the lost information will be restored from the Backup Block through said Backup Block Address. Said Logic-to-Entity converting sheet further records an Entity Block Address and at least a Backup Block Recording. The Backup Block Recording records a Chip Select Number, said Backup Block Address and a Source Block Address. The Chip Select Number is a symbol number of said signal CE2 to the second memory segment 212. Said Source Block Address is input after the control unit 200 activates the signal CE1 to the first memory segment 201, 211, while said Backup Block Address is input after the control unit 200 activates the signal CE2 to the second memory segment 212. After the information is simultaneously written into said first and second memory segments, the Source Block Address, the Backup Block Address and the Chip Select Number are recorded into the Backup Block Recording of the Logic-to-Entity converting sheet which is defined in a storage district. Said storage district is a part of the first memory segment 201, 211 activated through the signal CE1.

Figure 4:
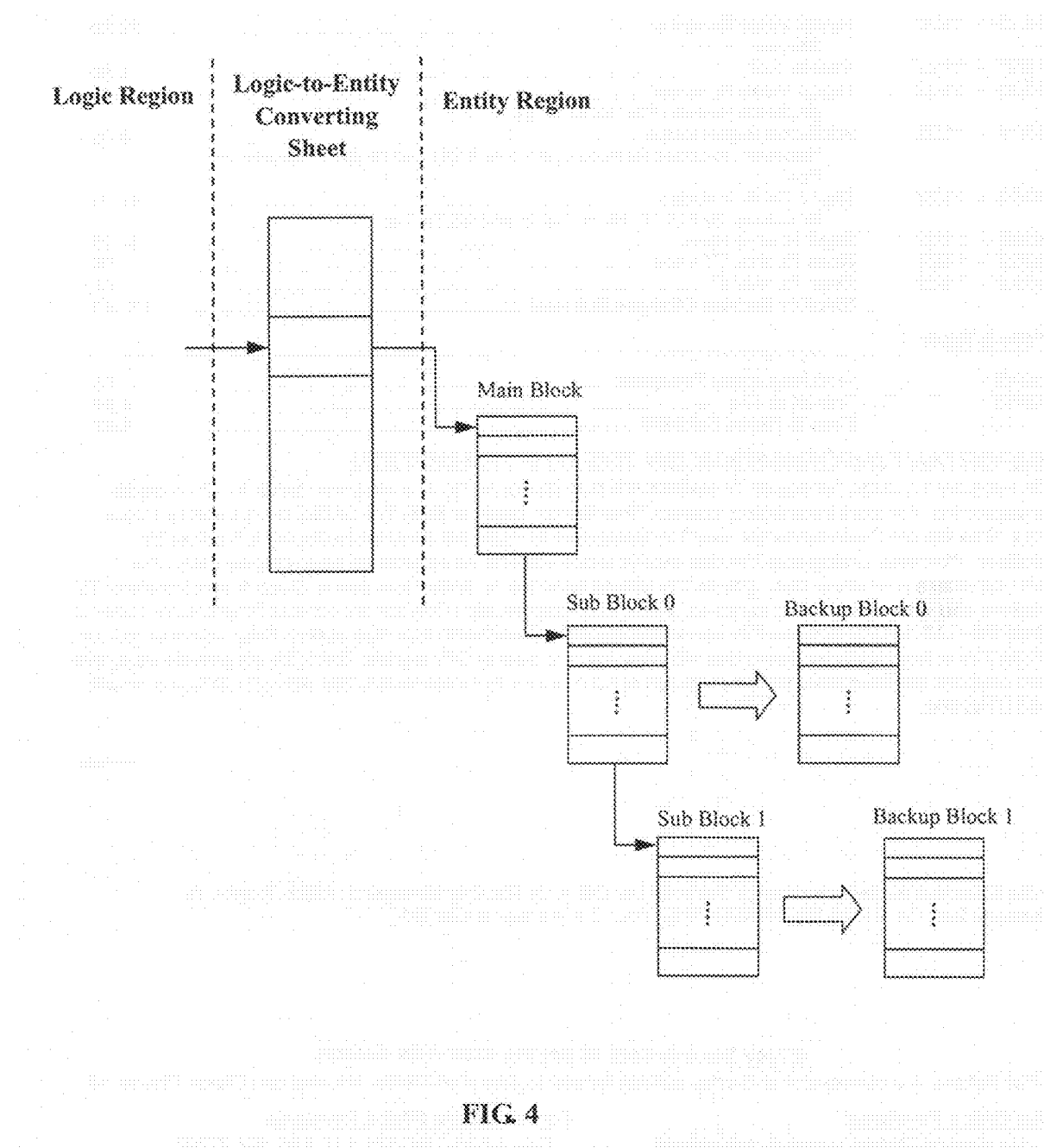
FIG. 4 is a flow chart showing the relationship between a Source Block and a Backup Block.

As referring to FIG. 4, the flow chart shows the relationship between said Source Block and the Backup Block. The Source Block includes a Main block and two Sub Blocks. Said Sub Block is used for recording the updated information of the Main block or a previous Sub Block. The Backup Block 0 and Backup Block 1 make a backup of the information written in Sub Block 0 and the Sub Block 1 respectively, which means the LSB memory page of the Backup Block 0 and Backup Block 1 is used to copy the LSB memory page of the Sub Block 0 and Sub Block 1. Once the LSB memory page of the Sub Block 0, 1 is fully written by the information or entirely erased up, the control unit 200 will check whether the Backup Block 0, 1 has made a backup of the information of said Sub Block 0, 1 correspondingly. If the Backup Block 0, 1 has already made a backup of the information, the control unit 200 will erase up the Backup Block 0, 1 in order to release the storage space of the Backup Block 0, 1 for storing other information.

Figure 5:
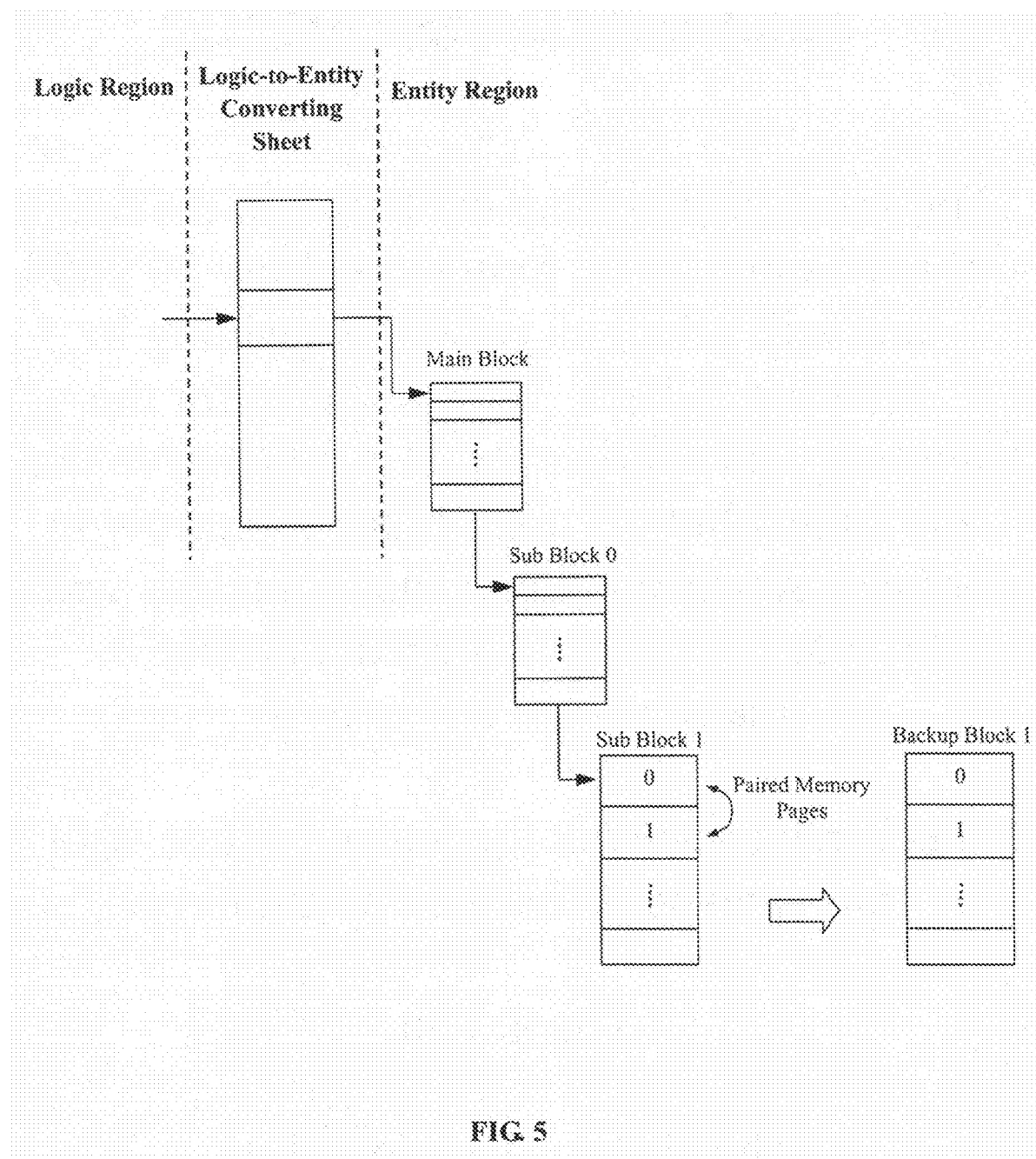
FIG. 5 is a flow chart showing the backup process between the Source Block and the Backup Block.

During the reading process of the information, if the information is ruined to lead an error in said reading process, and the Error Correction Code (ECC) fails to correct said error, the control unit 200 will start to check whether there is a Backup Block in the Logic-to-Entity converting sheet. If there is no Backup Block corresponding to the Sub Block, the error will be uncorrected. If there is a Backup Block for the Sub Block, the backup of the information in the Backup Block will be available to read and sent back to ensure a smooth reading process. As shown in FIG. 5, the flow chat shows the process of backupping the information between the Source Block and the Backup Block, the LSB memory page 0 and the MSB memory page 1 are defined as Paired Memory Pages. If an uncorrectable error happens during reading the LSB memory page 0 of Sub Block 1, the control unit 200 will check whether there is a Backup Block 1 corresponding to the Sub Block 1. If there is a Backup Block 1 corresponding to the Sub Block 1, the control unit 200 will read the information written in the LSB memory page 0 of said Backup Block 1 in order to restore the information which is previously written in the LSB memory page 0 of said Sub Block 1.

The Backup Block needs to occupy storage space of the MLC flash memory, and the number of the Backup Blocks in the Logic-to-Entity converting sheet is limited. So, it is necessary to recycle the Backup Blocks which are already used previously in order to release the storage space of the MLC flash memory. The present invention further provides a recycling method to the Backup Blocks. After the writing process to all memory pages of the Source Block is finished, or after the information written in the Source Block is entirely erased up, the control unit 200 will start to check as following ways:

1. After the control unit 200 entirely finishes the writing process to a last memory page of the Source Block, the control unit 200 starts to check the Backup Block Recording in the Logic-to-Entity converting sheet in order to know whether there is a Backup Block corresponding to said Source Block in the Entity Region. If the Backup Block really exists, the control unit 200 will get ready to recycle said Backup Block.

2. After the control unit 200 finishes erasing up the information in a Source Block of the Entity Region, the control unit 200 starts to check the Backup Block Recording in the Logic-to-Entity converting sheet in order to know whether there is a Backup Block corresponding to the Source Block in the Entity Region. If the Backup Block really exists, the control unit 200 will get ready to recycle said Backup Block.

After finishing above checking ways, the process of recycling the Backup Blocks will be started as follow: Firstly, the control unit 200 activates the signal CE2 to the second memory segment 202, 212, and then input an erasing order, the Backup Block Address and a starting order to erase the Backup Block. Finally, clean up the Backup Block Recording in said Logic-to-Entity converting sheet to finish recycling the Backup Block.

Above all, the present invention provides an electronic storage device and a method of reading/writing the information by using the Backup Block when an uncorrectable error happens. The information will be stored into two memory segments simultaneously, which makes the information in the Backup Block be available when the uncorrectable error happens. The Logic-to-Entity converting sheet will be revised to release the storage space of the Entity Region, which not only improves the reading/writing speed but also prolongs the lifetime of the MLC flash memory.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. An electronic storage device comprising:
a first memory segment having at least one source block to store information;
a second memory segment having at least one backup block corresponding to said source block to make a backup of the information in a LSB memory page of said source block; and
a control unit connecting with said first memory segment and second memory segment;
wherein said control unit reads/writes the first memory segment and second memory segment through two different signal channels respectively, the control unit recycles the backup block of the second memory segment not only after the source block of the first memory segment entirely finishes writing the information but also after said source block is erased up.

2. The electronic storage device as claimed in claim 1, wherein the control unit writes the information into said first memory segment and said second memory segment simultaneously, said source block of the first memory segment includes a main block and at least one sub block, said backup block of the second memory segment makes a backup of the information written in said sub block correspondingly.

3. The electronic storage device as claimed in claim 1, wherein the electronic storage device further includes a Logic-to-Entity converting sheet to record a backup block recording which records a chip select number, a backup block address and a source block address.

4. The electronic storage device as claimed in claim 3, wherein said control unit restores the information from said backup block through the backup block address in said Logic-to-Entity converting sheet when an uncorrectable error occurs during an information writing process.

5. The electronic storage device as claimed in claim 4, wherein each said first memory segment and said second memory segment respectively includes a plurality of memory units and a cache memory page to save the information temporarily before the information is written into the memory units.

6. An electronic storage method for an electronic storage device which comprises at least one source block to store information, at least one backup block corresponding to said source block to make a backup of the information in said source block and a control unit connecting with said source block and backup block, comprising following steps:

firstly, said control unit activating the source block through a signal and then inputting a writing order and a first store address, and thereafter the control unit deactivating the source block;

secondly, the control unit activating the backup block through another signal, then inputting a writing order and a second store address;

thereafter the control unit reactivating the source block;

then the control unit starting to write the information into the source block and the backup block simultaneously; and finally, the control unit erasing up the backup block to release storage space of the backup block.

7. The electronic storage method as claimed in claim 6, wherein the control unit checks the status of backup block and the source block during an information writing process until the control unit receives two writing finishing signals respectively from the source block and the backup block.

8. The electronic storage method as claimed in claim 7, wherein the control unit checks the backup block after an uncorrectable error occurs during an information writing process, and retrieves a backup of the information from the backup block which is a backup corresponding to a LSB memory page of said source block.

9. The electronic storage method as claimed in claim 7, wherein after the control unit entirely finishes the writing process to memory pages of the source block, or after the memory pages are erased up, the control unit starts to check the backup block corresponding to the source block and then erases up the backup block.

10. The electronic storage method as claimed in claim 7, wherein the control unit starts to check whether there is a backup block corresponding to said source block when an error occurs during an information reading process, if there is no backup block corresponding to said source block, the control unit do not correct said error.

\* \* \* \* \*